US010554136B1

(12) United States Patent
Miletic

(10) Patent No.: US 10,554,136 B1
(45) Date of Patent: Feb. 4, 2020

(54) CONTROL OF SECONDARY SWITCHES BASED ON SECONDARY WINDING VOLTAGE IN A POWER CONVERTER

(71) Applicant: Power Integrations, Inc., San Jose, CA (US)

(72) Inventor: Igor Miletic, Ottawa (CA)

(73) Assignee: Power Integrations, Inc., San Jose, CA (US)

( * ) Notice: Subject to any disclaimer, the term of this patent is extended or adjusted under 35 U.S.C. 154(b) by 0 days.

(21) Appl. No.: 16/054,299

(22) Filed: Aug. 3, 2018

(51) Int. Cl.
*H02M 3/335* (2006.01)
*H03K 17/06* (2006.01)
*H02M 1/00* (2006.01)

(52) U.S. Cl.
CPC ... *H02M 3/33569* (2013.01); *H02M 3/33515* (2013.01); *H03K 17/063* (2013.01); *H02M 3/33592* (2013.01); *H02M 2001/0058* (2013.01); *H03K 2217/0081* (2013.01)

(58) Field of Classification Search
CPC ..... H02M 3/33592; H02M 2001/0058; H02M 3/335; H02M 3/33507; H02M 3/33569; H02M 3/33576; H02M 3/33515; H02M 1/08; H02M 1/083; Y02B 70/1475; Y02B 70/1433; H03K 17/063; H03K 17/691; H03K 2217/0081
See application file for complete search history.

(56) References Cited

U.S. PATENT DOCUMENTS

| | | | | |
|---|---|---|---|---|
| 9,812,855 | B2* | 11/2017 | Lee | H02M 1/32 |
| 2007/0263421 | A1* | 11/2007 | Kyono | H02M 3/33592 363/127 |
| 2012/0140531 | A1* | 6/2012 | Lin | H02M 3/33507 363/21.12 |
| 2015/0049522 | A1* | 2/2015 | Iorio | H02M 3/33576 363/21.03 |
| 2015/0103563 | A1* | 4/2015 | Wang | H02M 3/33592 363/17 |
| 2015/0131336 | A1* | 5/2015 | Choi | H02M 3/3353 363/21.02 |
| 2016/0020699 | A1* | 1/2016 | Shen | H02M 1/44 363/15 |
| 2016/0079878 | A1* | 3/2016 | Lin | H02M 3/33592 363/21.14 |
| 2018/0302000 | A1* | 10/2018 | Moon | H02M 3/33592 |

* cited by examiner

*Primary Examiner* — Gustavo A Rosario-Benitez
(74) *Attorney, Agent, or Firm* — Andrew J. Borja

(57) ABSTRACT

A secondary controller including a control circuit coupled to a secondary switch of a power converter. The control circuit is coupled to receive a secondary switch voltage signal representative of the secondary switch, and turns ON the secondary in response in response to how many times the secondary switch voltage signal crosses below a turn on threshold to a limit set in a last half period. The control circuit turns OFF the secondary switch when the secondary switch voltage signal crosses above a turn off threshold.

24 Claims, 7 Drawing Sheets

CONTROL OF SECONDARY SWITCHES BASED ON SECONDARY WINDING VOLTAGE IN A POWER CONVERTER

BACKGROUND INFORMATION

Field of the Disclosure

The present invention relates generally to power converters, and more specifically to controlling secondary switches.

Background

Switch mode power supplies are used in a variety of household or industrial appliances that require a regulated direct current (dc) voltage for their operation. A controller for switch mode power supplies for controlling the power switch for the transfer of energy can use PWM (pulse width modulation) or PFM (pulse frequency modulation) to regulate the output voltage.

One type of power supply topology is a resonant switch mode power supply. Resonant switched mode power supplies with PFM control have some advantages, which include having sinusoidal waveforms and intrinsic soft switching compared to non-resonant converters. Resonant switch mode power supplies can also operate at higher frequencies with low switching loss, utilize smaller magnetic elements, which therefore require smaller packaging, and still operate with high efficiency. Since resonant switch mode power supplies generally do not have waveforms with sharp edges (e.g. waveforms having high di/dt or dv/dt). EMI performance is improved, which therefore enables the use of smaller EMI filters. The output of a resonant switch mode power supply is often achieved by sensing the output and controlling the power supply in a closed loop by varying the switching frequency.

LLC converters are a type of resonant switched mode power supply, which utilizes the resonance between two inductors and a capacitor. LLC converters are popular due to the savings on cost and size which can be realized by utilizing the magnetizing and leakage inductance of the transformer as at least a part of the resonance component of the LLC converter. In addition, LLC converters can achieve stability when they are operated at above resonance with zero voltage switching, which results in less switching loss and increased efficiency. Furthermore, LLC converters can achieve output regulation in a narrow band of frequency control because of their negative and high slope gain characteristic when operating above resonance.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
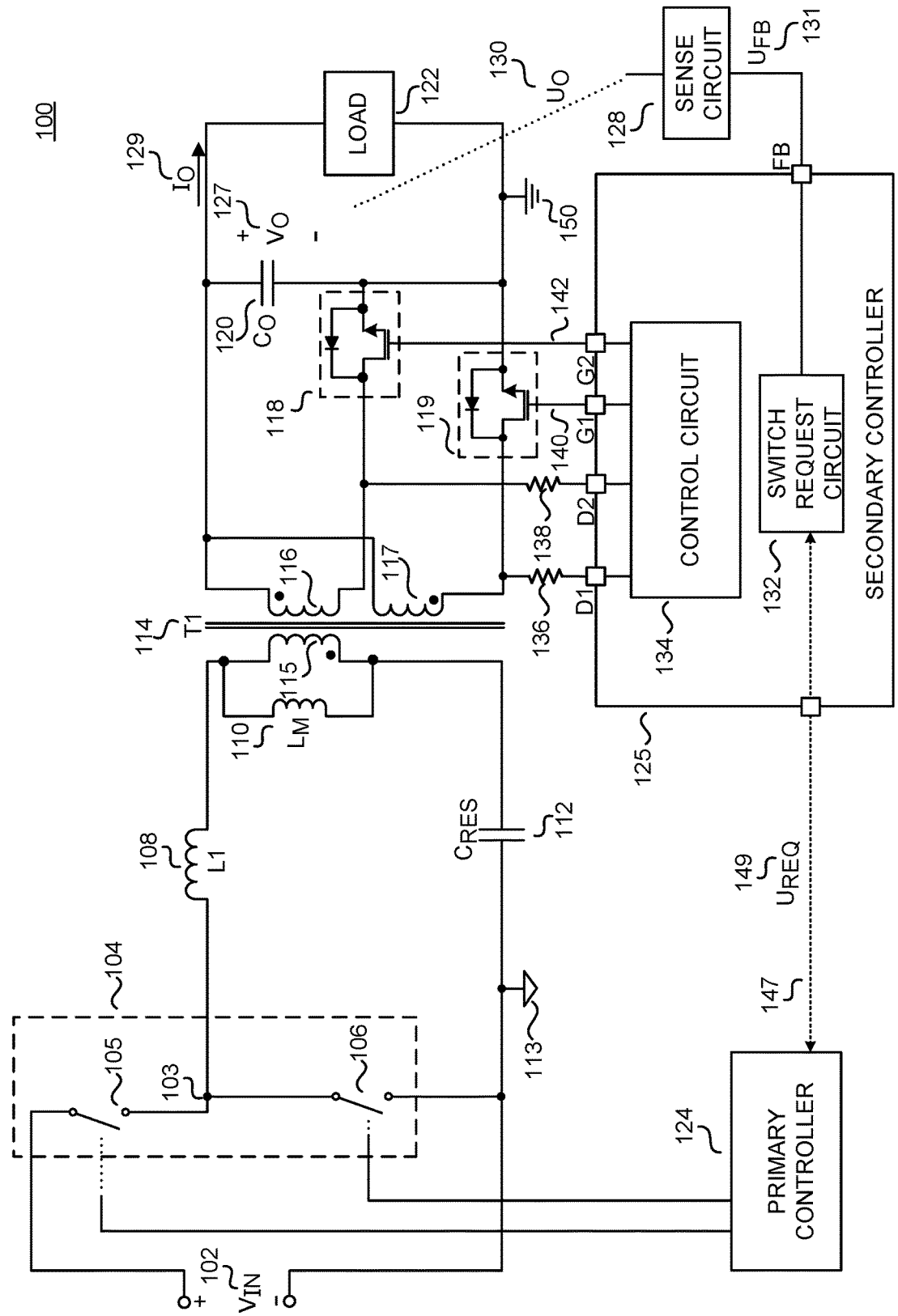
FIG. 1 illustrates one example of a half bridge power converter that includes a controller, in accordance with an embodiment of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding, of various embodiments of the present invention. Also, common but well-understood elements that are useful or necessary in a commercially feasible embodiment are often not depicted in order to facilitate a less obstructed view of these various embodiments of the present disclosure.

DETAILED DESCRIPTION

Examples of a control circuit to determine when to turn on a secondary switch in a power converter are described herein. In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

Resonant power converters can provide higher efficiency due to soft-switching relative to hard switching power converters. When power is supplied to the output, the secondary side of a resonant converter includes diodes used for rectification. A constant voltage drop across the diode can be a source of power loss and reduced efficiency. To reduce the constant voltage drop and improve efficiency, the diode can be replaced by an active controlled switch such as a metal-oxide semiconductor field-effect transistor (MOS- FET) or bipolar junction transistor (BJT). An actively controlled switch on the secondary side can be referred to as a secondary switch.

However, the challenge of controlling secondary switches is to determine the right time to turn it on. The time to turn on the actively controlled switch where it is most efficient when the secondary switch signal is at or close to zero. In one example, the secondary switch signal can be a drain voltage of the secondary switch. At higher loads, it is easier to distinguish when the secondary switch signal is at or close to zero. However, as the load becomes lighter, the secondary switch signal can include ringing due to parasitics. If the secondary switch signal crosses the turn on threshold of on the secondary switch, the secondary switch can turn on at the wrong time due to ringing caused by parasitics. In one embodiment, a control circuit can determine when to turn on the secondary switch based on the previous behavior of the secondary switch signal. For example, the control circuit can count the number of times a secondary switch signal crosses below a threshold, and saves the count to be used for the next half cycle.

To illustrate, FIG. 1 shows a functional block diagram of an example resonant power converter 100 illustrated as an LLC half bridge converter including a primary controller 124 and a secondary controller 125 in accordance with the teachings of the present disclosure. FIG. 1 includes a high side switch 105, a low side switch 106, an inductance L1 108, a magnetizing inductance 110, a resonant capacitor 112, an energy transfer element T1 114 secondary side switches 118, 119, an output capacitor 120, a load, 122, a sense circuit 128, resistances 136, 138, input return 150 and a secondary controller 125. In one example, the high side switch 105 and low side switch 106 can be referred to as power switches 104.

Energy transfer element T1 114 further includes a magnetizing inductance $L_M$ 110, a primary winding 115, a first output winding 116, and a second output winding 117. The primary winding 115 may be referred to as an input winding, and the output windings 115,116 may be referred to as a secondary winding In some examples, the inductance of L1 108 may be an embedded property of the energy transfer element T1 114 such that the inductance L1 106 is not discrete physical component. The secondary controller 125 includes a switch request circuit 132, and a control circuit 134.

In operation, the resonant power converter 100 provides output power to the load 122 from an input voltage $V_{IN}$ 102. In one example, the input voltage $V_{IN}$ 102 is a rectified input voltage from an ac voltage source. The high side switch 105 is coupled to receive the input voltage $V_{IN}$ 102 from a first end of the high side switch 105. The second end of high side switch 105 is coupled to a first end of the low side switch 106 by half bridge node 103. The second end of low side switch 106 is further coupled to the input return 113. The inductance L1 108 is coupled to one end of primary winding 115, and the resonant capacitor $C_{RES}$ 112 is coupled to the other end of the primary winding and may function together as a tank circuit coupled to the high side switch 105 and low side switch 106 at the half bridge node 103. Energy transfer element T1 114 is coupled to the tank circuit such that energy is transferred from the primary winding 115 to the output windings 116 and 117 in response to the switching of the high side switch 105 and low side switch 106. First output winding 116 is coupled to a first secondary switch 118. The first secondary switch 118 includes a transistor used as a synchronous rectifier and is controlled by a secondary drive signal 140. Energy is transferred and rectified by secondary switch 118 when is closed and the high side switch 105 is turned ON and the low side switch 106 is OFF.

The second output winding 117 is coupled to a second secondary switch 119. The secondary switch 119 includes a transistor and a rectifier used as a synchronous rectifier which is controlled by a secondary drive signal 142. Energy is transferred and rectified by secondary switch 119 is closed and when the high side switch 105 is turned OF and the low side switch 106 is ON.

The output capacitor $C_O$ 120 and load 122 are coupled to the first secondary switch 118 and the second secondary 119. An output is provided to the load 126 and may be provided as either an output voltage $V_O$ 127, and output current $I_O$ 129, or a combination of the two. For a resonant power converter, the output voltage is controlled by adjusting the switching frequency and not the duty cycle. The duty cycle of a LLC half bridge is ideally fifty percent for the second power switch and first power switch.

The resonant power converter 100 further includes circuitry to regulate the output, which is exemplified as output quantity $U_O$ 130. in general, the output quantity $U_O$ 130 is either an output voltage $V_O$127, an output current $I_O$ 129, or a combination of the two. A sense circuit 128 is coupled to sense the output quantity $U_O$130 and to provide a feedback signal $U_{FB}$ 131, which is representative of the output quantity $U_O$130. The feedback signal $U_{FB}$ 131 may be a voltage signal or a current signal.

The switch request circuit 132 can receive the feedback signal $U_{FB}$ 131 to determine when to request a transfer of energy from the primary side of the resonant power converter. In response to a feedback signal $U_{FB}$ 131 that is below a threshold, the switch request circuit 132 generates a request signal $U_{REQ}$ 149 that is communicated to a primary controller 124. In one example, there may be a galvanic isolation (not shown) between the secondary controller 125 and the primary controller 124. In one example, the request signal $U_{REQ}$ 149 can be communicated through a communication link. In one example, the communication is a magnetically coupled communication link. In another example, the request signal $U_{REQ}$ 149 can be communicated through an optically coupled communication link.

As mentioned previously, monitoring the voltage at the drain of secondary switch 118 can indicate when to turn ON and OFF the secondary switch 118. To measure the voltage at the drain of secondary switch 118, optionally a resistance 138 is coupled to one end of output winding 117. To measure the drain at the voltage of secondary switch 119, optionally a resistance 136 is coupled to one end of output winding 116. As will be explained in FIG. 2, the control circuit is coupled to receive a secondary switch voltage signal of the secondary switch. The secondary drive signal is generated in response to how many times the secondary switch voltage signal crosses below a turn on threshold to a limit set in a last half period. The control circuit turns ON the secondary switch by a secondary drive signal.

Figure 2A:
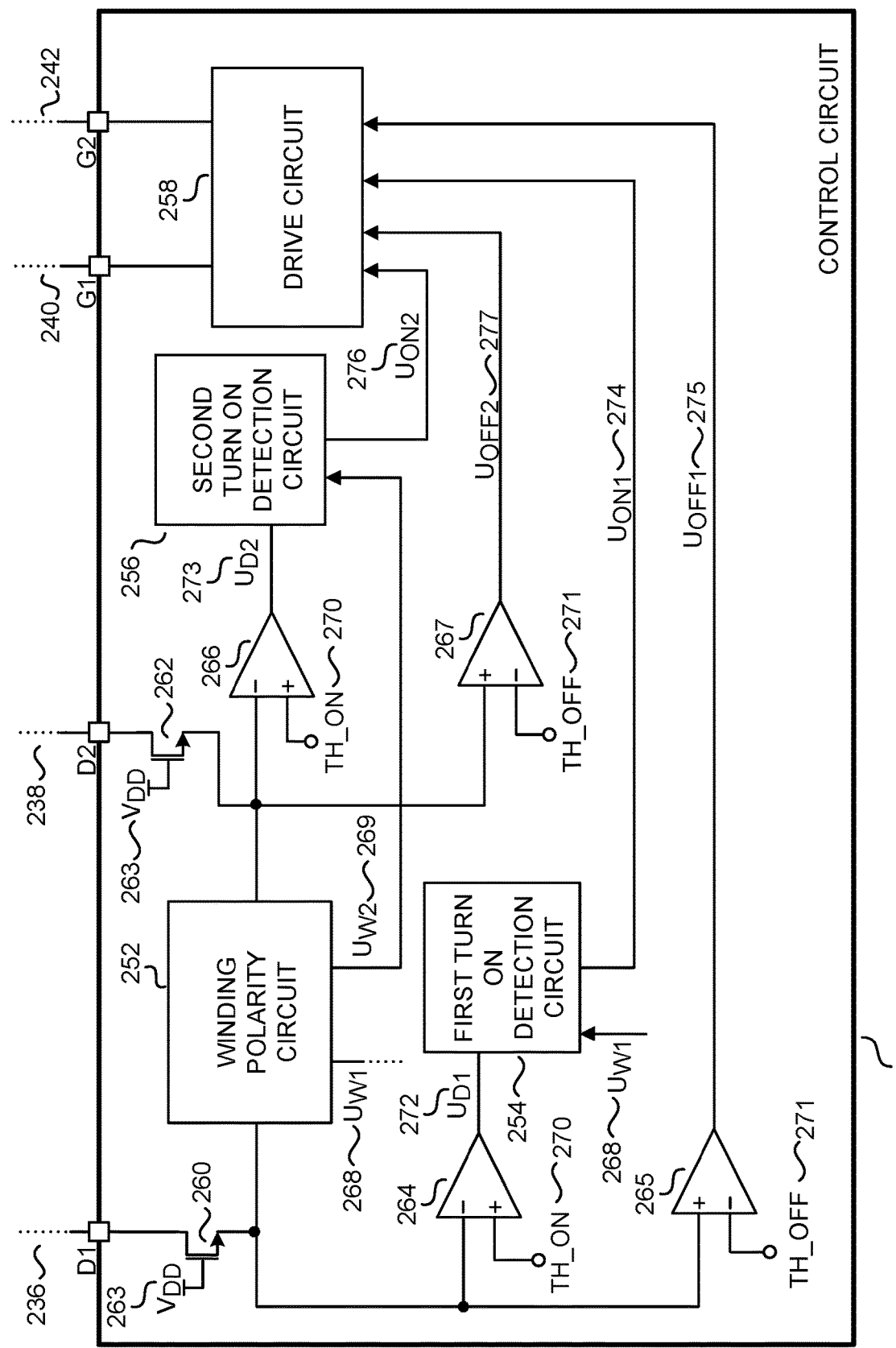
FIG. 2A illustrates one example of a control circuit of the secondary controller of FIG. 1, in accordance with an embodiment of the present disclosure.

FIG. 2A illustrates one example of a control circuit of the secondary controller of FIG. 1. Thus, it is noted that control circuit 234 of FIG. 2 may be one example of control circuit 134 of FIG. 1, and that similarly named and numbered elements referenced below are coupled and function similar to as described above.

The control circuit 234 is coupled to receive the first secondary switch signal 236 and the second secondary switch signal 238, and generates the secondary drive signals 240 and 241. The control circuit 234 includes a winding polarity circuit 252, a first turn on detection circuit 254, a second turn on detection circuit 256, a drive circuit 258, high voltage transistors 260, 262 and comparators 264, 265, 266, 267.

As will be discussed, the operation to turn on the first secondary switch and the second secondary switches are identical. In one example, the control circuit 234 receives the first secondary switch signal 236. The high voltage transistor 260 is coupled to receive the first secondary switch signal 236 at a drain terminal of the high voltage transistor 260. The gate terminal of the high voltage transistor 260 is coupled to a voltage reference $V_{DD}$ 263. The high voltage transistor 260 is needed because the first secondary switch signal 236 could be at a voltage greater than supported by the secondary controller, and the secondary controller may not be compatible to sense it directly. In one example, the first secondary switch signal 236 could be at a voltage up to 150 volts. The high voltage transistor 260 provides a proportional voltage that is compatible for use within the secondary controller in the order of −1 volt to 5 volts. Comparator 264 is coupled to receive the secondary switch signal 236 at the inverting input, and an ON threshold TH_ON 270. Comparator 264 is coupled to generate the first turn on detection signal $U_{D1}$ 272 when the first secondary switch voltage signal 236 crosses below the ON threshold TH_ON 270. A first turn on detection circuit 254 generates a first turn on signal $U_{ON1}$ 274 when a count reaches the limit set in the last half period. Comparator 265 is coupled to receive the first secondary switch signal 236 at the non-inverting input, and an OFF threshold TH_OFF 271 at the inverting input. Comparator 265 generates a first turn off signal $U_{OFF1}$ 275 when the first secondary switch voltage signal 236 is above the turn OFF threshold TH_OFF 271. The drive circuit 258 is coupled to receive the first turn on signal $U_{ON1}$ 274, the first turn off signal $U_{OFF1}$ 275 to control the first secondary switch 118 with a secondary drive signal 240.

To control the second secondary switch, the control circuit 234 receives the second secondary switch signal 238. The high voltage transistor 262 is coupled to receive second secondary switch signal 238 at a drain terminal of the high voltage transistor 262. The gate terminal of the high voltage transistor 262 is coupled to a voltage reference $V_{DD}$ 263. The high voltage transistor 262 is needed because the second secondary switch signal 238 could be at a voltage greater than supported by the secondary controller and the secondary controller may not be compatible to sense it directly. In one example, the second secondary switch signal 238 could be at a voltage up to 150 volts, The high voltage transistor 262 provides a proportional voltage that is compatible for use within the secondary controller in the order of −1 volt to 5 volts. Comparator 266 is coupled to receive the second secondary switch signal 238 at the inverting input, and an ON threshold TH_ON 270 at the non-inverting input. Comparator 266 is coupled to generate the second turn on detection signal $U_{D2}$ 273 when the second secondary switch voltage signal 238 crosses below the ON threshold TH_ON 270. A second turn on detection circuit 256 generates a second turn on signal $U_{ON2}$ 276 when a count reaches the limit set in the last half period. Comparator 267 is coupled to receive the second secondary switch signal 238 at the non-inverting input, and an OFF threshold TH_OFF 271 at the inverting input. Comparator 265 generates a second turn off signal $U_{OFF2}$ 276 when the second secondary switch voltage signal 238 is above the turn OFF threshold TH_OFF 271.

The winding polarity circuit 252 receives the secondary switch signals 236, 238 and generates a first clock winding signal $U_{W1}$ 268 and a second clock winding signal $U_{W2}$ 269. The first winding clock signal $U_{W1}$ 268 represents when the secondary switch voltage signal 236 changes polarity. In one example, when the secondary switch 118 is closed, the secondary switch voltage signal 238 should be close to or at zero volts. The first winding clock signal $U_{W1}$ can be a logic low. Meanwhile, when the secondary switch 119 is open, the secondary switch voltage signal 238 should be at a value greater than zero. The second clock winding signal $U_{W2}$ 269 should be logic high. Either the first winding signal $U_{W1}$ 268 or second winding signal UW2 269 can be logic high at a time. Further details of the winding polarity circuit will be provided in FIG. 3.

Figure 2B:
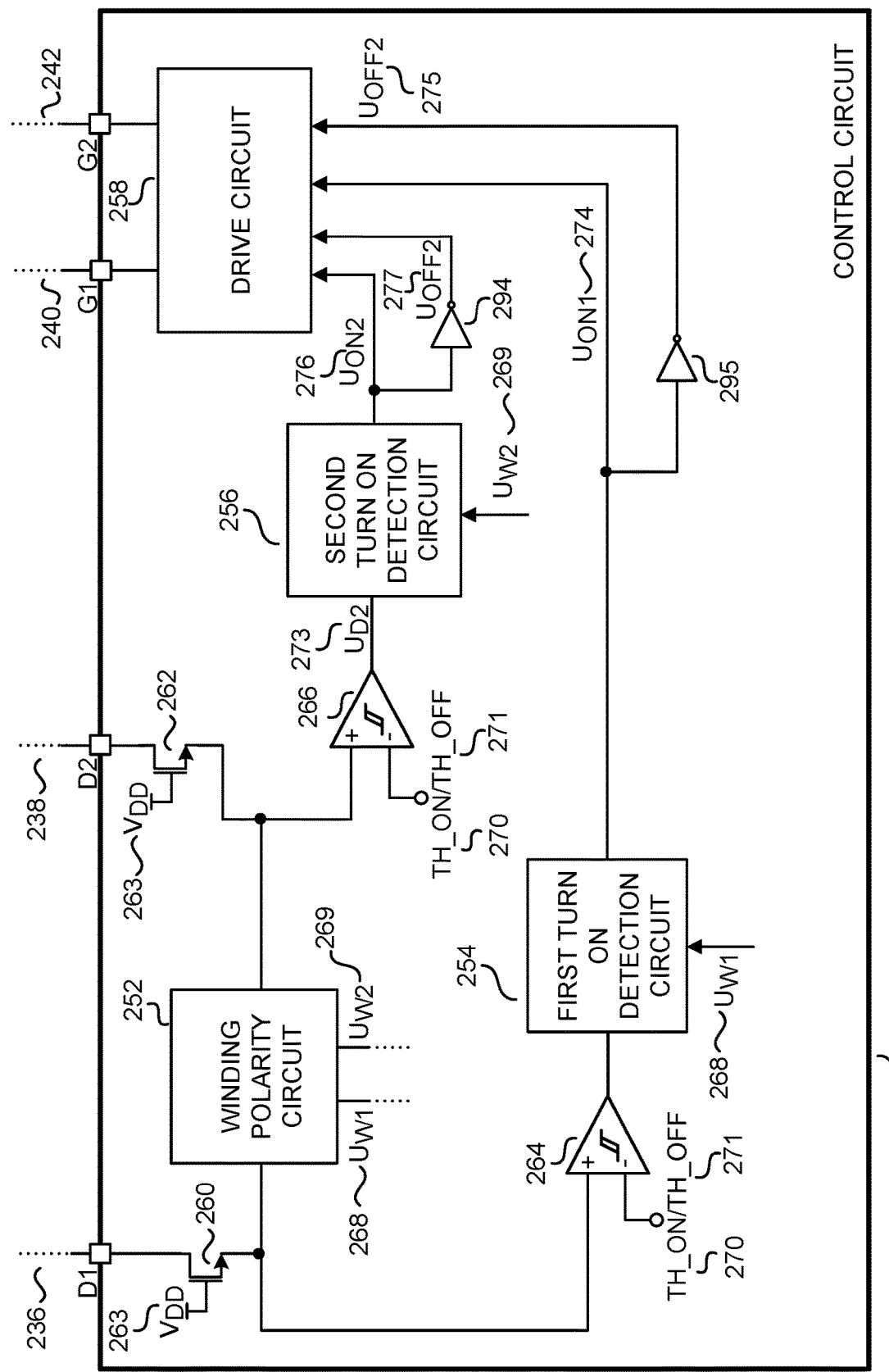
FIG. 2B illustrates another example of a control circuit of the secondary controller of FIG. 1, in accordance with an embodiment of the present disclosure.

FIG. 2B illustrates another example of a control circuit of the secondary controller of FIG. 1, in accordance with an embodiment of the present disclosure. In FIG.2A, separate comparators 264 and 265 determine when to turn on and off the first secondary switch, and separate comparators 266 and 267 determine when to turn off the second secondary switch. In FIG. 2B, to determine when to turn on and off the first secondary switch, a comparator 264 with hysteresis can be used to fulfill the same function. The comparator 264 with hysteresis is coupled to receive the first secondary switch signal 236 at the non-inverting input and at the inverting input is coupled to receive the turn on threshold TH_ON 270, with a hysteresis threshold of the turn off the threshold TH_OFF 271. To determine when to turn on and off the second secondary switch, a comparator 266 with hysteresis is used. The threshold for comparator 266 is the turn ON threshold TH_ON 270, and hysteresis threshold can be the OFF threshold TH_OFF 27.

Figure 3:
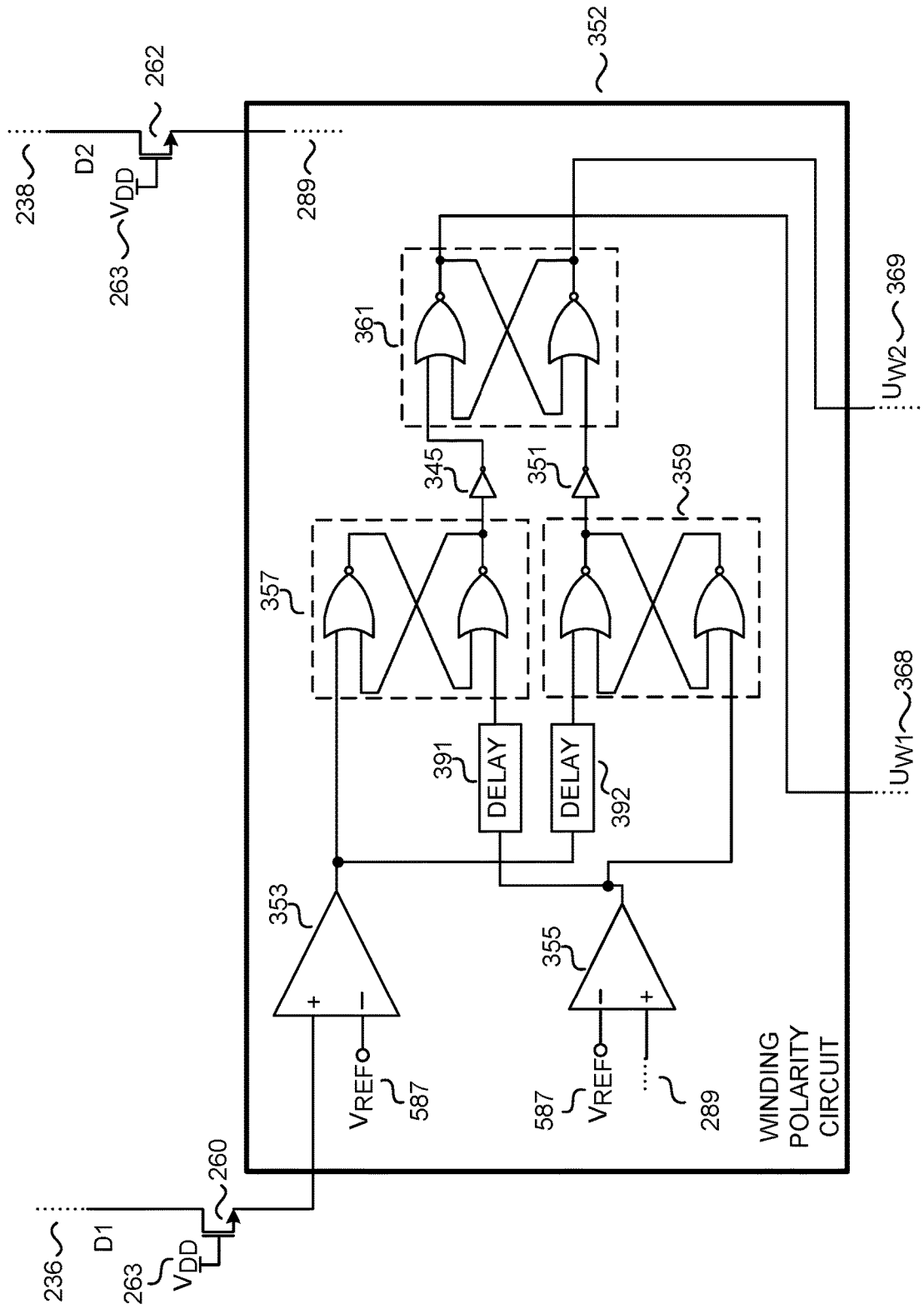
FIG. 3 illustrates one example of a winding polarity circuit, in accordance with an embodiment of the present disclosure.

In addition, FIG. 3 includes inverters 294 and 295. When the first turn on signal $U_{ON1}$ is a logic high, therefore the first turn off signal $U_{OFF1}$ is a logic low. In addition, if the first turn on signal $U_{ON1}$ is a logic low, therefore the first turn off signal $U_{OFF1}$ is a logic high. When the second turn on signal $U_{ON2}$ 276 is a logic high, therefore the first turn off signal $U_{OFF2}$ 277 is a logic low. When the second turn on signal $U_{ON2}$ 276 is a logic low, therefore the second turn off signal $U_{OFF2}$ 277 is a logic high.

FIG. 3 illustrates a winding polarity circuit as shown in FIG. 2, Thus, it is noted that winding polarity circuit 352 of FIG. 1 may be one example of winding polarity circuit 252 of FIG. 2, and that similarly named and numbered elements referenced below are coupled and function similar to as described above.

The winding polarity circuit 352 is coupled to receive the first secondary switch 236 voltage signal and generates a first winding clock signal $U_{W1}$ 368 when the first secondary switch voltage signal 336 changes polarity. Furthermore, the winding polarity circuit 352 is coupled to receive the second secondary switch 238 and generates a second winding clock signal $U_{W2}$ 369 when the second secondary switch voltage 338 changes polarity. The winding polarity circuit 352 includes inverters 345, 351 comparators 353, 355, latches 357, 359, 361, and delay circuits 391, 392. The comparator 353 is coupled to receive the first secondary switch signal 336 at the non-inverting input, and is coupled to a reference threshold at the inverting input. The comparator 355 is coupled to receive the second secondary switch signal 338 at the non-inverting input, and is coupled to a reference threshold at the inverting input.

In operation, the comparator 353 determines if the first secondary switch signal 236 and the reference threshold is greater than a threshold reference TH_REF 587, The output of comparator 353 is coupled to latches 357, 359 and captures the output of the comparator 353. In one example latches 357, 359, 356 are SR NOR latches. The output of latch 357 is coupled to an inverter 345. The output of the inverter 345 is coupled to latch 361, which generates the first winding clock signal $U_{W1}$ 368. To generate the second winding lock signal $U_{W2}$ 369, the comparator 355 determines if the second secondary switch signal 338 is greater than threshold reference TH_REF 587. The output of comparator 355 is coupled to latches 357, 359 and captures the output of the comparator 353. The output of latch 359 is coupled to an inverter 345. The output of the inverter 345 is coupled to latch 361, which generates the second winding clock signal $U_{W2}$ 359.

Figure 4:
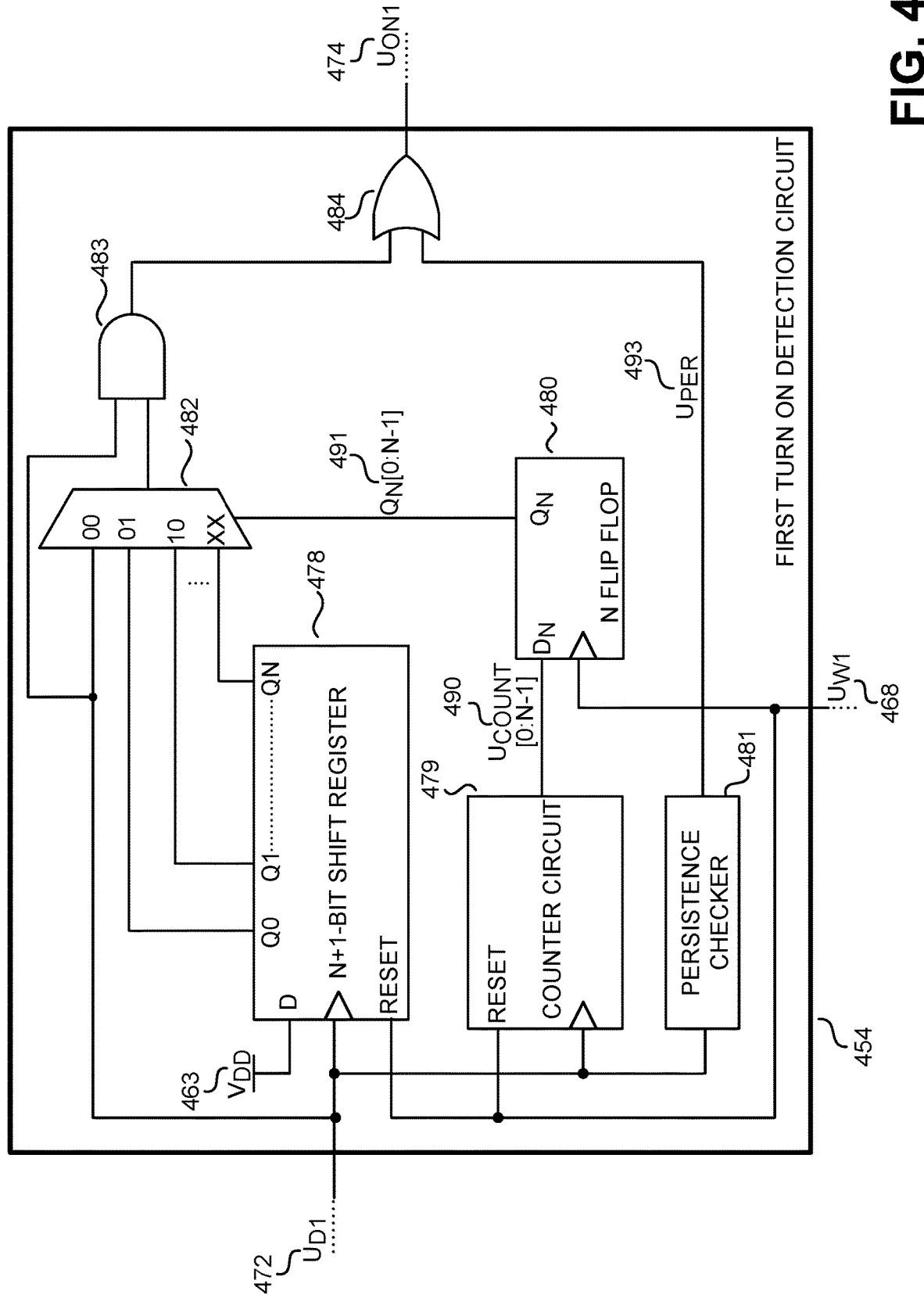
FIG. 4 illustrates one example of a first turn on detection circuit, in accordance with an embodiment of the present disclosure.

FIG. 4 illustrates a turn on detection circuit and is representative of both the first turn on detection circuit and second turn on detection circuit as shown in FIG. 2 Thus, it is noted that the first turn on detection circuit 254 and second turn on detection circuit 256 of FIG. 2 may be one example of first turn on detection circuit of FIG. 4, and that similarly named and numbered elements referenced below are coupled and function similar to as described above. What will be described is with respect to the first turn on detection circuit, however the operation for the second turn on detection is substantially same.

The first turn on detection circuit 454 is coupled to receive the first turn on detection signal $U_{D1}$ 472, a first winding clock signal $U_{W1}$ 468 and generates a first turn on signal $U_{ON1}$ 474. The first turn on detection circuit includes a shift register 478, counter circuit 479, flop flip 480, a persistence checker 481, a multiplexer 482, a first logic gate 483, and a second logic gate 484.

In operation, the shift register 478 is coupled to receive the first turn on detection signal $U_{D1}$ 472 at the clock terminal, a supply voltage $V_{DD}$ 463 is coupled to an input terminal, and a first winding clock signal $U_{W1}$ 468 at the reset terminal, and generates a shift register output. The shift register can include N-bits, where N is representative of the number of output bits of the shift register. A counter circuit 479 is coupled to receive the first detection signal $U_{D1}$ 472 at the clock terminal, the first winding clock signal $U_{W1}$ 468 at the reset terminal and generates an output count signal $U_{COUNT}$ 490. The count signal $U_{COUNT}$ 490 can be an N-bit signal where N is representative of the number of bits. The counter circuit increments the count signal $U_{COUNT}$ 490 in response to the first detection signal $U_{D1}$ 472. The N flip flop 480 is coupled to store the count signal when the first winding signal $U_{W1}$ 468 is a logic high. In one example, the number N represents the same number of bits for flip flop 480 and the counter circuit 479. The stored count signal is the limit that is used in the next half period in order to determine when to generate the first turn on signal $U_{ON1}$ 474. In next half period, the shift register 478 and counter circuit 479 are reset by the first winding clock signal $U_{W1}$ 468. As the first turn on detection signal $U_{D1}$ 472 toggles, the shift register 478 generates outputs denoted by $Q_O$, $Q_1$ and $Q_N$, where N is representative of the number of outputs of the shift register. A first input of multiplexer is coupled to receive the first turn on detection signal $U_{D1}$ 472. Furthermore, multiplexer 482 is coupled to receive a plurality of outputs of the shift register. The stored count signal $Q_N$ 491 selects the output of the multiplexer 482. The first logic gate 483 is coupled to receive the shift register output and the first turn on detection signal $U_{D1}$ 472. The output of logic gate 483 is asserted when the first detection signal $U_D$ 472 is logic high, and the output of the multiplexer 482 is logic high. The OR logic gate 484 is coupled to receive the output of the logic gate 483, which generates a first turn on signal $U_{ON1}$ 474.

In another example, the count signal $U_{COUNT}$ 490 may change from one half cycle to the next due to changing load conditions. As such, the output of logic gate 484 would not be logic high because there may not be an instance in which both the first turn on detection signal $U_{D1}$ 472 and the output of the multiplexer 482 is logic high. To circumvent this potential issue, the first turn on detection circuit 454 further includes a persistence checker 381 that is coupled to receive the first turn on detection signal $U_{D1}$ 472, and generates a persistence signal $U_{PER}$ 493 after an expiration of an adaptive maximum deadtime or an adaptive blanking time. The adaptive maximum deadtime can be measured from the period of ringing of one turn on threshold to the next turn off threshold. In one example, the adaptive maximum deadtime can be 1 microsecond. In another example, the adaptive maximum deadtime can adapt to the ringing frequency during turn-on of the secondary switch. In other words, if the ringing period is shorter than 1 microsecond, the adaptive deadtime can reduce the deadtime to the ringing frequency.

Figure 5:
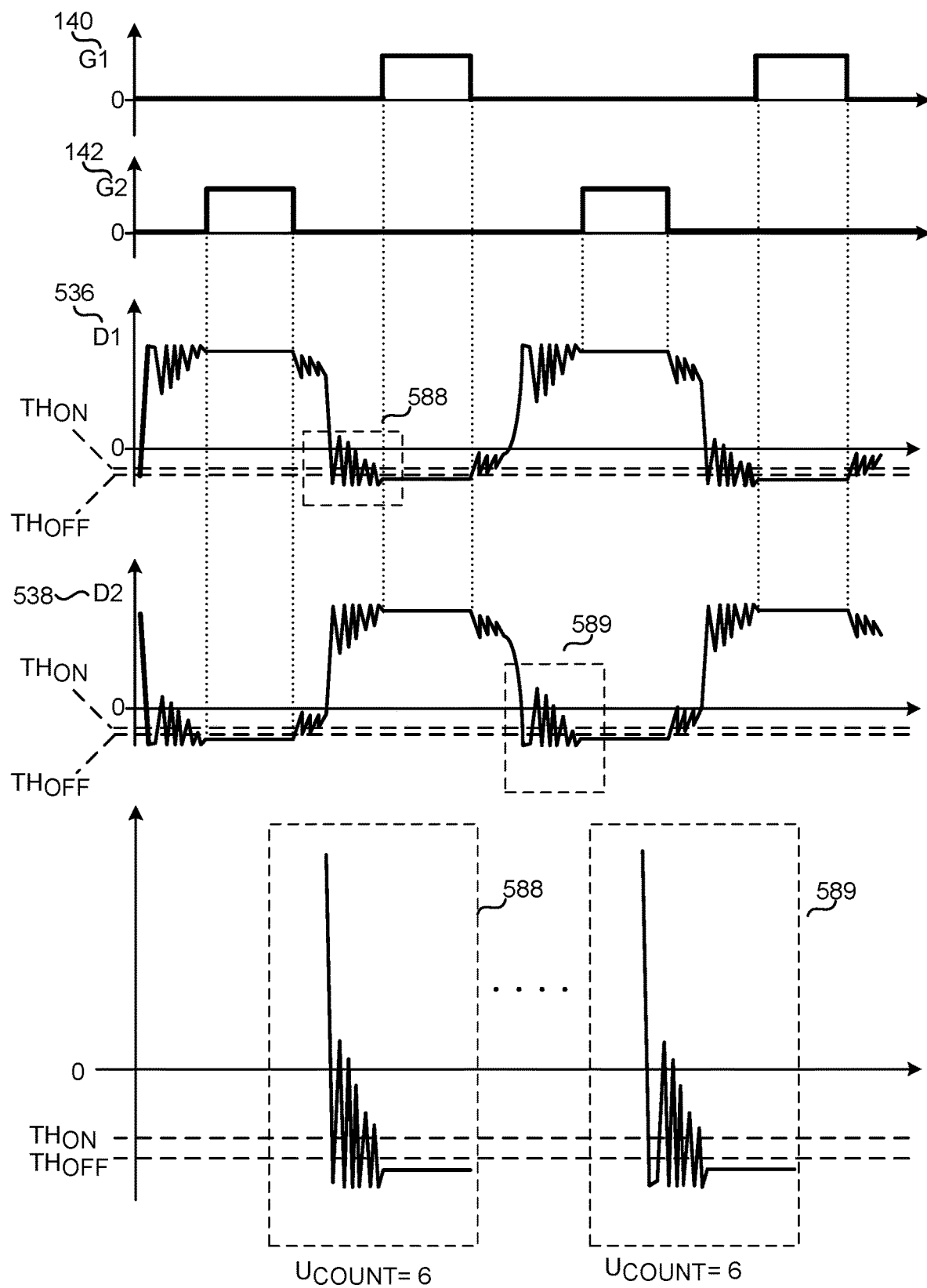
FIG. 5 illustrates a timing diagram of the operation of the turn on detection circuit, in accordance with an embodiment of the present disclosure.

FIG. 5 illustrates a timing diagram illustrating the operation of the secondary controller to determine when to turn on the secondary switch. FIG. 5 includes a first secondary drive signal G1 540, a second secondary drive signal G2 542, a secondary switch signal 536 representative of the drain voltage of the first secondary switch, a secondary switch signal 538 representative of the drain voltage of the second secondary switch.

As mentioned previously, as the load of the resonant power converter becomes lighter, the ringing of the secondary switch signal 536 is more pronounced as illustrated inside boxes 588 and 589. As shown in the third timing diagram, the first turn on detection circuit determines how many times the secondary switch signal 536 crosses below the turn on threshold even in the presence of ringing. In this example, the count signal $U_{COUNT}$ is 6, which is representative of the number of times the secondary switch signal 536 must cross below the turn ON threshold before a first secondary drive signal G1 540 is asserted. A close-up of the waveform in box 588 is shown in the fourth timing diagram.

As shown in the fourth timing diagram, the second turn on detection circuit determines how many times the second secondary switch signal 538 crosses below the turn on threshold in the presence of ringing. In this example, the count signal $U_{COUNT}$ is 6, which is representative of the number of times the second secondary switch signal 536 must cross below the turn ON threshold TH_ON before a second secondary drive signal G2 542 is asserted. A close-up of the waveform in box 589 is shown in the fourth timing diagram.

Figure 6:
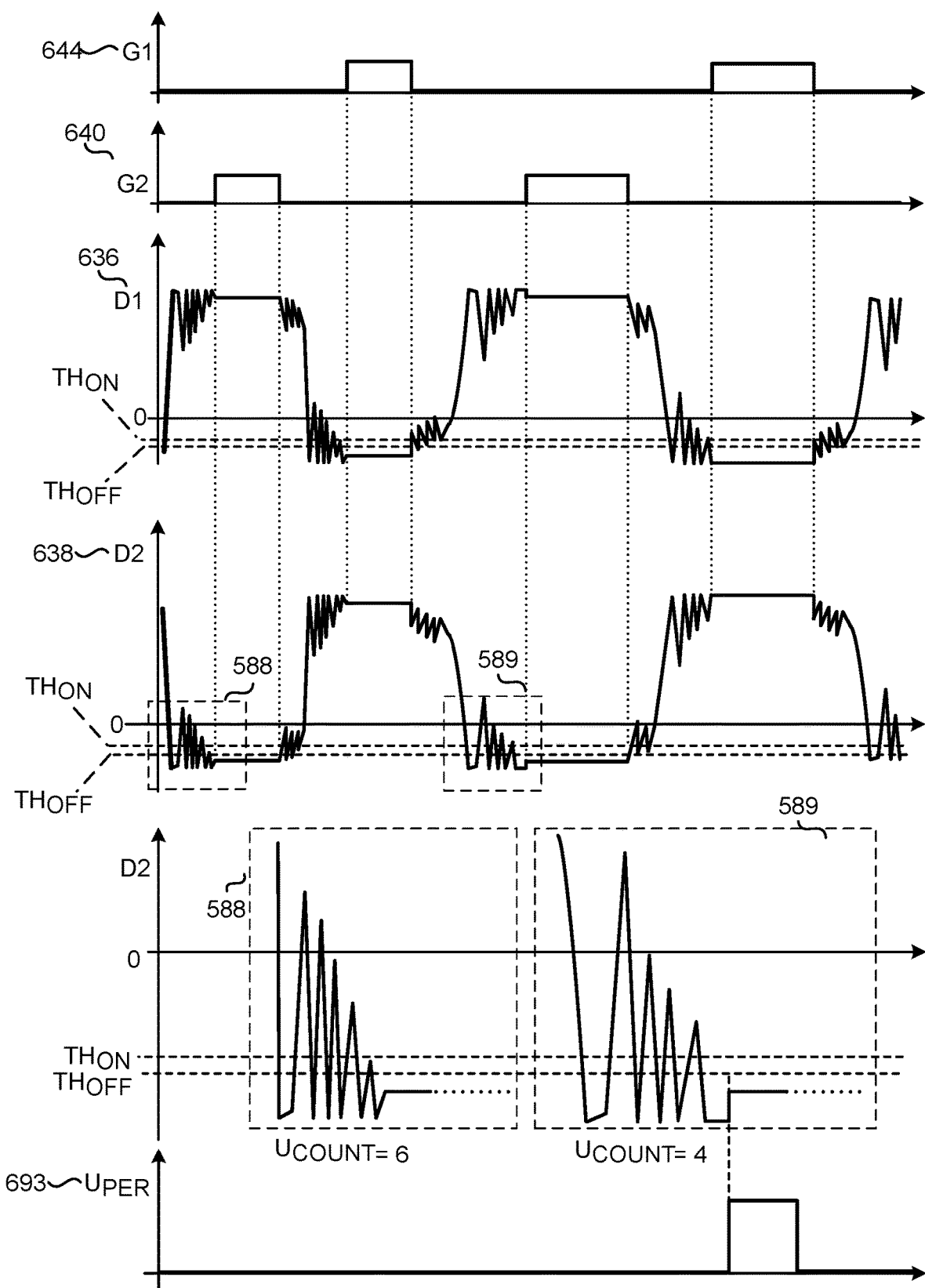
FIG. 6 illustrates another example of a timing diagram of the operation the turn on detection circuit, in accordance with an embodiment of the disclosure.

FIG. 6 illustrates a timing diagram illustrating the operation of the secondary controller to determine when to turn on the secondary switch when the count changes from one half cycle to the next. FIG. 6 includes a first secondary drive signal G1 540, a second secondary drive signal G2 542, a secondary switch signal 536 representative of the drain voltage of the first secondary switch, a secondary switch signal 538 representative of the drain voltage of the second secondary switch.

As mentioned previously, as the load of the resonant power converter becomes changes, the ringing in the first secondary switch signal 536 and the second secondary switch signal 538 caused by parasitics can vary. In one example, at full load, parasitics are negligible as such the ringing is minimal in comparison to a light load condition. In FIG. 6, as shown in the fourth timing diagram of the second secondary switch signal 538, the second turn on detection circuit determines how many times the secondary switch signal crosses below the turn ON threshold TH_ON. In this example for a first half period, the count signal $U_{COUNT}$ is 6, while in the second half period, the count signal $U_{COUNT}$ is 4. A close-up of the waveforms in boxes 588 and 589 are shown in the bottom timing diagram. When the second secondary switch signal crosses 538 below a turn ON threshold TH_ON after a count set in the last half period, the second secondary drive signal 540 transitions to logic high to turn on the secondary switch. The count signal $U_{COUNT}$ of 6 is stored for the next half cycle of the second secondary switch signal 538. At next half cycle, the second turn on detection circuit expects to see a count signal $U_{COUNT}$ value of 6 before a second secondary drive signal 540 is generated A close-up of the waveform in box 489 is shown in the bottom timing diagram. However, the secondary switch signal 538 only crosses below the turn on threshold TH_ON four times. The persistence checker of the secondary turn on detection circuit would generate a persistence signal $U_{PER}$ 539, and the second secondary drive signal 540 can be generated. Although only the half cycles of the second secondary switch signal 538 are shown, the same operation can apply to the first secondary switch signal 536.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

What is claimed is:

1. A secondary controller, comprising:
   a control circuit coupled to a secondary switch, wherein the control circuit is configured to receive a secondary switch voltage signal of the secondary switch, wherein the control circuit turns ON the secondary switch in response to a secondary drive signal, wherein the secondary drive signal is generated in response to how many times the secondary switch voltage signal crosses below a turn on threshold to a limit set in a last half period, wherein the control circuit turns OFF the secondary switch when the secondary switch voltage signal crosses above a turn off threshold,
   the control circuit comprising:
     a first comparator configured to receive the secondary switch voltage signal, the first comparator further configured to generate a first detection signal in response to a comparison of the secondary switch voltage signal and the turn on threshold;
     a first turn on detection circuit configured to receive the first detection signal and a first winding clock signal, the first turn on detection circuit further configured to generate a first turn on signal when a count reaches the limit set in the last half period;
     a second comparator configured to receive the secondary switch voltage signal, the second comparator further configured to generate a first turn off signal in response to a comparison of the secondary switch voltage signal and the turn off threshold; and
     a drive circuit configured to receive the first turn on signal and the turn off signal, the drive circuit further configured to generate the secondary drive signal to control the secondary switch, the secondary switch configured to turn ON in response to the first turn on signal, and the secondary switch further configured to turn OFF in response to the turn off signal.

2. The secondary controller of claim 1, wherein the control circuit comprises a winding polarity circuit configured to receive the secondary switch voltage signal, the winding polarity circuit further configured to generate the first winding clock signal when the secondary switch voltage signal changes polarity.

3. The secondary controller of claim 2, wherein the first turn on detection circuit comprises:
   a shift register configured to shift a shift register output in response to the first detection signal;
   a counter configured to increment a count signal in response to the first detection signal;
   a flip flop configured to receive the count signal, the flip flop configured to generate a stored count signal, wherein the stored count signal overwrites the limit set in the last half period;
   a multiplexer configured to select a specific shift register output in response to the stored count signal;
   a first logic gate configured to receive an output of the multiplexer and the first detection signal; and
   a second logic gate configured to generate the first turn on signal in response to the output of the first logic gate and a persistence checker signal.

4. The secondary controller of claim 3, wherein the first turn on detection circuit further comprises a persistence checker configured to receive the first detection signal, the persistence checker further configured to generate the persistence checker signal in response to an absence of how many times the secondary switch voltage signal reaches the limit set in the last half period and an expiration of an adaptive maximum time.

5. The secondary controller of claim 3, wherein the counter is reset in response to the first winding clock signal.

6. The secondary controller of claim 2, wherein the control circuit comprises a high voltage transistor configured to receive the secondary switch voltage signal of the secondary switch.

7. The secondary controller of claim 1, wherein the control circuit further comprises:
   a third comparator configured to receive a second secondary switch voltage signal, the third comparator further configured to generate a second detection signal in response to the comparison of the second secondary switch voltage signal and the turn on threshold;
   a second turn on detection circuit configured to receive the second detection signal and a second winding clock signal, the second turn on detection circuit further configured to generate a second turn on signal when the count reaches the limit set in the last half period; and
   a fourth comparator configured to receive the second secondary switch voltage signal, the fourth comparator further configured to generate a second turn off signal in response to a comparison of the second secondary switch voltage signal and the turn off threshold.

8. The secondary controller of claim 1, wherein the first comparator and second comparator is substituted by a single comparator with a hysteresis threshold, the single comparator configured to generate the first detection signal in response to the comparison of the secondary switch voltage signal and the turn on threshold, the single comparator further configured to generate the first turn off signal in response to the comparison of the secondary switch voltage signal crossing below the turn on threshold and the hysteresis threshold.

9. The secondary controller of claim 7, wherein the third comparator and fourth comparator are substituted by a single comparator with a hysteresis threshold, wherein the single comparator configured to generate the second turn on detection signal in response to the comparison of the second secondary switch voltage signal and the turn on threshold, the single comparator further configured to generate the second turn off signal in response to the comparison of the second secondary switch voltage signal crossing below the turn on threshold and the hysteresis threshold.

10. A resonant power converter controller, comprising:
   a primary controller configured to control switching of a high side switch and a low side switch in response to a request signal representative of an output of a resonant power converter;
   a secondary controller coupled to the primary controller, the secondary controller comprising:
      a switch request circuit configured to receive a feedback signal representative of the output of the resonant power converter, the switch request circuit further configured to generate the request signal in response to the feedback signal to request a transfer of energy from an input of the resonant power converter to the output of the resonant power converter; and
      a control circuit coupled to a secondary switch, the control circuit configured to turn ON the secondary switch in response to a detection of a secondary switch voltage signal being below a turn on threshold compared against a stored count signal, wherein the stored count signal is stored for a next half cycle of the secondary switch voltage signal, the control circuit configured to turn OFF the secondary switch in response to secondary switch voltage being above a turn off threshold.

11. The resonant power converter controller of claim 10, wherein the control circuit further comprises:
   a first comparator configured to generate a first detection signal in response to a comparison of the secondary switch voltage signal and the turn on threshold;
   a first turn on detection circuit configured to receive the first detection signal and a first winding clock signal, the first turn on detection circuit further configured to increment a count signal, the first turn on detection circuit further configured to generate a first turn on signal when the count signal is equal to or greater than the stored count signal;
   a second comparator configured to generate a first turn off signal in response to a comparison of the secondary switch voltage signal and the turn off threshold; and
   a drive circuit configured to generate a synchronous drive signal to control the secondary switch in response to the first turn on signal and the first turn off signal.

12. The resonant power converter controller of claim 11, wherein the control circuit comprises a winding polarity circuit configured to receive the secondary switch voltage signal, the winding polarity circuit further configured to generate the first winding clock signal when the secondary switch voltage signal changes polarity.

13. The resonant power converter controller of claim 11, wherein the first turn on detection comprises:
   a shift register configured to shift a shift register output in response to the first detection signal;
   a counter configured to increment the count signal in response to the first detection signal;
   a flip flop configured to store the count signal in response to the first winding clock signal, wherein the count signal is the stored count signal;
   a multiplexer configured to select the shift register output in response to the stored count signal;
   a first logic gate configured to receive the shift register output and the first detection signal; and
   a second logic gate configured to generate the first turn on signal in response to the output of the first logic gate and a persistence checker signal.

14. The resonant power converter controller of claim 13, wherein the first turn on detection circuit further comprises a persistence checker configured to receive the first detection signal, the persistence checker further configured to generate the persistence checker signal at an expiration of an adaptive maximum time.

15. The resonant power converter controller of claim 12, wherein the control circuit comprises a high voltage transistor configured to receive the secondary switch voltage of the secondary switch.

16. The resonant power converter controller of claim 11, wherein the control circuit further comprises:
   a third comparator configured to generate a second detection signal in response to the comparison of a secondary secondary switch voltage signal and the turn on threshold;
   a second turn on detection circuit configured to receive the second detection signal and a second winding clock signal, the second turn on detection circuit further configured to generate a second turn on signal when the count signal is equal to or greater than the stored count signal; and
   a fourth comparator configured to generate a second turn off signal in response to a comparison of the second secondary switch voltage signal and the turn off threshold.

17. A resonant power converter comprising:
   a high side switch configured to receive an input voltage at one end of the high side switch;
   a low side switch coupled to an input return at one end of the low side switch, wherein another end of the low side switch is coupled to another end of the high side switch at a half bridge node, wherein a voltage of the half bridge node resonates between a ground reference and the input voltage;
   a tank circuit coupled to the high side switch and the low side switch at the half bridge node;
   an energy transfer element coupled to the tank circuit to transfer energy from an input of the resonant power converter to an output of a resonant power converter in response to switching of the high side switch and the low side switch; and
   a resonant power converter controller, comprising:
      a primary controller configured to control switching of a high side switch and a low side switch in response to a request signal representative of an output of the resonant power converter;
      a secondary controller coupled to the primary controller, the secondary controller comprising:
         a switch request circuit configured to receive a feedback signal representative of the output of the resonant power converter, the switch request circuit further configured to generate the request signal in response to the feedback signal to request a transfer of energy from the input of the resonant power converter to the output of the resonant power converter; and a control circuit coupled to a secondary switch, the control circuit configured to receive a secondary switch voltage signal of the secondary switch, the control circuit further configured to assert a turn ON of the secondary switch in response to a plurality of times the secondary switch voltage signal is found below a turn on threshold, the control circuit further configured to assert a turn OFF of the secondary switch in response to the secondary switch voltage signal being above a turn off threshold, the control circuit further comprising:

a first comparator configured to receive the secondary switch voltage signal, the first comparator further configured to generate a first detection signal in response to a comparison of the secondary switch voltage signal and the turn on threshold;

a first turn on detection circuit configured to receive the first detection signal and a first winding clock signal, the first turn on detection circuit further configured to generate a first turn on signal when a count signal is equal to or greater than a previous count;

a second comparator configured to receive the secondary switch voltage signal, the second comparator further configured to generate a first turn off signal in response to a comparison of the secondary switch voltage signal and the turn off threshold; and a drive circuit configured to generate a synchronous drive signal to control the secondary switch in response to the first turn on signal and the first turn off signal.

18. The resonant power converter of claim 17, wherein the control circuit comprises a winding polarity circuit configured to receive the secondary switch voltage signal, the winding polarity circuit further configured to generate the first winding clock signal when the secondary switch voltage signal changes polarity.

19. The resonant power converter of claim 17, wherein the first turn on detection circuit comprises:

a shift register configured to shift a shift register output in response to the first detection signal;

a counter configured to receive the first detection signal, the counter further configured to increment the count signal in response to the first detection signal;

a flip flop configured to store the count signal in response to the first winding clock signal;

a multiplexer configured to select the shift register output in response to the count signal;

a first logic gate configured to receive the shift register output and the first detection signal; and a second logic gate configured to generate the first turn on signal in response to the output of the first logic gate and a persistence signal.

20. The resonant power converter of claim 19, wherein the first turn on detection circuit further comprises a persistence checker configured to receive the first detection signal, the persistence checker further configured to generate the persistence checker signal in response to an absence of how many time the secondary switch voltage signal crosses below a turn on threshold a limit set in the last half period and an expiration of adaptive maximum time.

21. The resonant power converter of claim 17, wherein the control circuit comprises a high voltage transistor configured to receive the secondary switch voltage signal of the secondary switch.

22. The resonant power converter of claim 17, wherein the primary controller and secondary controller are galvanically isolated from each other.

23. The resonant power converter of claim 22, wherein the secondary controller communicates the request signal to the primary controller through a magnetically coupled communication link.

24. The resonant power converter of claim 22 wherein the secondary controller communicates the request signal to the primary controller through an optically coupled communication link.

* * * * *